(12) United States Patent
Teifel et al.

(10) Patent No.: US 7,157,934 B2
(45) Date of Patent: Jan. 2, 2007

(54) PROGRAMMABLE ASYNCHRONOUS PIPELINE ARRAYS

(75) Inventors: John R. Teifel, Albuquerque, NM (US); Rajit Manohar, Ithaca, NY (US)

(73) Assignee: Cornell Research Foundation, Inc., Ithaca, NY (US)

(*) Notice: Subject to any disclaimer, the term of this patent is extended or adjusted under 35 U.S.C. 154(b) by 69 days.

(21) Appl. No.: 10/921,349

(22) Filed: Aug. 19, 2004

(65) Prior Publication Data

US 2005/0077918 A1   Apr. 14, 2005

Related U.S. Application Data

(60) Provisional application No. 60/495,897, filed on Aug. 19, 2003.

(51) Int. Cl.
*H03K 19/173*   (2006.01)

(52) U.S. Cl. ............................ 326/38; 326/41; 326/46; 708/490

(58) Field of Classification Search ............ 326/37–41, 326/93–98, 53; 708/490, 520, 521, 670
See application file for complete search history.

(56) References Cited

U.S. PATENT DOCUMENTS

| | | | | |
|---|---|---|---|---|
| 4,845,633 A | * | 7/1989 | Furtek | 326/38 |
| 5,197,140 A | * | 3/1993 | Balmer | 711/220 |
| 5,339,447 A | * | 8/1994 | Balmer | 377/82 |
| 5,457,644 A | * | 10/1995 | McCollum | 708/230 |
| 5,592,405 A | * | 1/1997 | Gove et al. | 708/518 |
| 5,805,477 A | * | 9/1998 | Perner | 708/232 |
| 6,140,836 A | * | 10/2000 | Fujii et al. | 326/35 |

OTHER PUBLICATIONS

Scott Hauck, et al., "An FPGA For Implementing Asynchronous Circuits," IEEE Design & Test of Computers, vol. 11 (No. 3), pp. 60-69, (Fall, 1994), no month.

Ryusuke Konishi, et al., "PCA-1: A Fully Asynchronous, Self-Reconfigurable LSI," Proceedings 7th IEEE International Symposium on Asynchronous Circuits and Systems (ASYNC '01), (2001), no month.

R. Payne, "Asynchronous FPGA Architectures," IEE Proceedings-Computers and Digital Techniques, vol. 143 (No. 5), pp. 282-286, (Sep. 1996).

C. Traver, et al., "Cell Designs for Self-Timed FPGAs," Proceedings of the 2001 ASIC/SOC Conference, IEEE, pp. 175-179, (2001), no month.

* cited by examiner

*Primary Examiner*—Don Le
(74) *Attorney, Agent, or Firm*—Jones,Tullar&Cooper, P.C.

(57) ABSTRACT

High-performance, highly pipelined asynchronous FPGAs employ a very fine-grain pipelined logic block and routing interconnect architecture. These FPGAs, which do not use a clock to sequence computations, automatically "self-pipeline" their logic without the designer needing to be explicitly aware of all pipelining details. The FPGAs include arrays of logic blocks or cells that include function units, conditional units and other elements, each of which is constructed using basic asynchronous pipeline stages, such as a weak condition half buffer and a precharge half buffer.

26 Claims, 12 Drawing Sheets

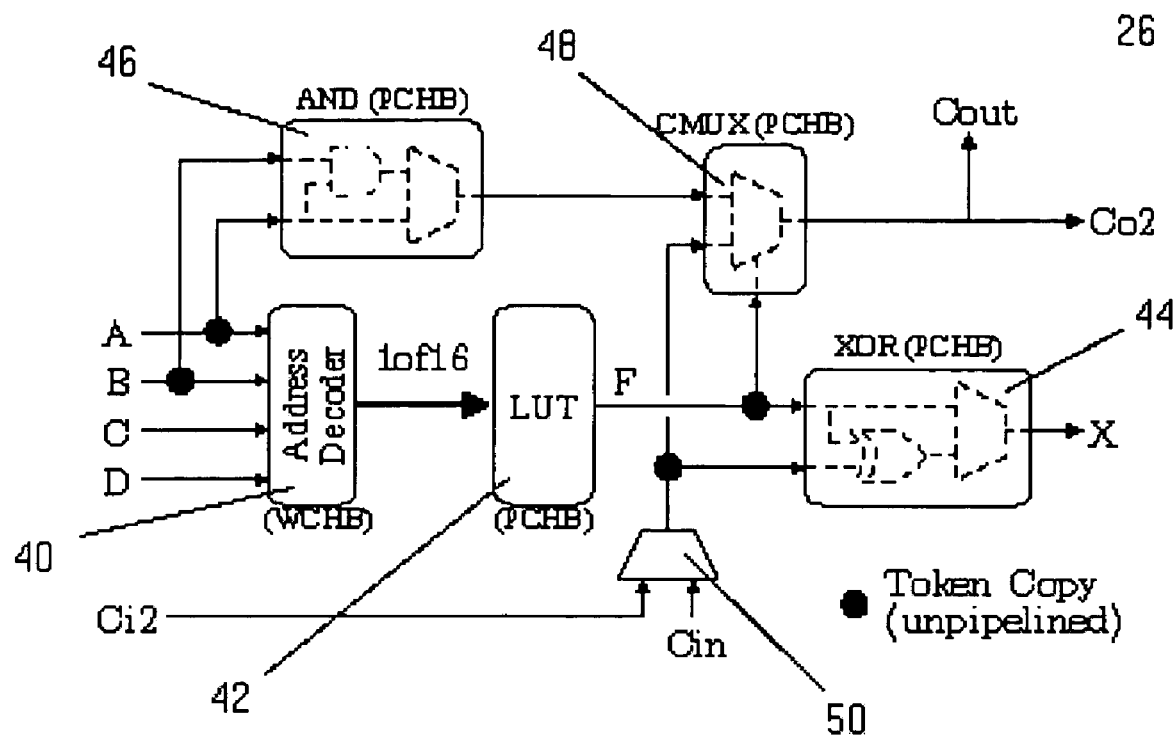
FIG. 5
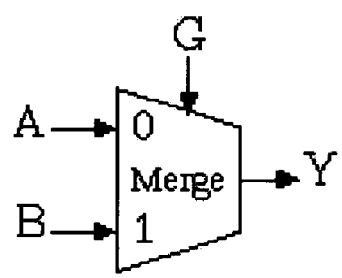
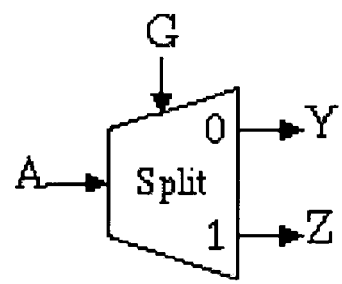
FIG. 7A	FIG. 7B

Precharge Evaluation Circuit

Handshake Control Circuit

PROGRAMMABLE ASYNCHRONOUS PIPELINE ARRAYS

CROSS REFERENCE TO RELATED APPLICATIONS

This application claims the benefit, under 35 U.S.C. 119(e), of U.S. Provisional Application No. 60/495,897, filed Aug. 19, 2003, which is hereby incorporated by reference in its entirety.

GOVERNMENT SPONSORSHIP STATEMENT

This invention arose out of research that was supported in part by the Multidisciplinary University Research Initiative (MURI) under the Office of Naval Research Contract N00014-00-1-0564, and in part by an NSF CAREER award under contract CCR 9984299. The US Government has certain rights in the invention.

BACKGROUND OF THE INVENTION

1. Field of the Invention

The present invention relates in general to pipelined asynchronous logic circuits that can be employed to implement programmable logic circuits such as Field Programmable Gate Arrays (FPGAs) without the use of a global or system clock. Logic blocks formed from fine grain pipelined logic elements, each including only a small amount of logic, can be used to implement any desired logic function and communicate with one another using an asynchronous hand shaking technique.

2. Description of the Background Art

Most existing FPGA architectures rely on the use of a global or system clock to synchronize operation of the various logic gates in the array. These clocked systems suffer from a number of inherent drawbacks. For example, pipelined logic circuits are typically employed in FPGAs in which groups of logic blocks or elements are connected in sequence to carry out a desired complex logic operation. It is often necessary to change the depth (i.e. number of logic blocks in the sequence) of one or more pipelines to change the FPGA's programming. Changing local pipeline depths in a clocked system can require global retiming of the entire system since the delays imposed by the pipeline vary with its depth. Adding high-speed retiming hardware support to a clocked FPGA incurs a significant register overhead. In addition, clocked FPGAs are prone to delay variation induced errors that can result from temperature and supply voltage fluctuations, as well as from physical imperfections of the circuit chip, for example. Further, clocked FPGAs are not efficient from an energy usage standpoint because all of the logic gates in the array are enabled by each clock pulse, even when many of the gates are not required for a given computation.

The use of asynchronous circuits in programmable logic arrays and the like can overcome the foregoing drawbacks associated with clocked FPGAs. However, while the first FPGA was introduced by Xilinx in 1985 and the first asynchronous microprocessor was designed at Caltech in 1989, very little work has been performed in the last two decades to combine asynchronous and programmable circuit technology. Moreover, what work has been done in this area has not been particularly successful and has been based largely on programmable clocked circuits. These FPGAs are limited to low-throughput logic applications because their asynchronous pipeline stages are either built up from gate-level programmable cells or use bundled-data pipelines. One example of a fabricated asynchronous FPGA chip using bundled-data pipelines operated at an un-encouraging maximum of 20 MHz in a 0.35 μm CMOS process. Another drawback of previously proposed asynchronous FPGAs is that they could not use generic synchronous FPGA place and route tools. For example, the CAD tools for one asynchronous architecture known as the Montage FPGA architecture needed to enforce the isochronic fork delay assumption required for safe prototyping of QDI circuits. A need therefore remains for an asynchronous FPGA architecture that provides enhanced performance over conventional clocked FPGAs.

SUMMARY OF THE INVENTION

The present invention addresses the foregoing need through provision of a high-performance pipelined asynchronous logic gate array architecture that is suitable for use in FPGAs and other programmable asynchronous systems. The architecture is based on the use of very fine-grain pipelines in which each pipeline stage contains only a small amount of logic (e.g., a 1-bit full-adder) and combines computation with data latching, such that explicit output latches are absent from the pipeline. More particularly, each pipeline stage used in the preferred embodiments is characterized by the fact that the stage employs a data channel for its inputs and handshaking to control data flow in and out of the stage. This pipeline style achieves high data throughput and can also be used to design energy-efficient systems.

In the preferred embodiments, the FPGA architecture is implemented using two discrete types of high-throughput fine-grain pipeline stages that act as building blocks for each element in the array. These stages are formed from basic logic circuits and include a weak-condition half buffer (WCHB) and a precharge half-buffer (PCHB). Both the WCHB and the PCHB each include two input data rails and two output data rails that act as the data channels which enable these stages to be interconnected to one another in any desired combination. The stages also each include an enable line that provides handshaking flow control. The pipeline stages are thus combined to form the circuit elements necessary to implement an FPGA. The circuit elements include heterogeneous pipelined logic blocks that carry out various programmable logic functions, pipelined switch boxes that interconnect the logic blocks in a desired manner and pipelined early-out carry chains.

In the first preferred embodiment, the logic block includes five notable components that efficiently implement asynchronous computations. These include a group of input buffers for input pipelining and routing, a function unit that can implement any function of four variables, a conditional unit for conditionally sending or receiving message tokens, an output copy stage for copying and routing result tokens generated by the function or conditional units, and a state unit for feeding the function unit output back to its input for initialization.

The main pipeline of the function unit consists of an address decoder, a lookup table (LUT), and an XOR output stage. A secondary pipeline, which is optionally configured when carry computations are necessary, examines the function unit inputs and generates the carry-out. The output of the function unit can be copied to the output copy, to the state unit, and/or to the conditional unit. The address decode stage reads the function unit inputs and generates an encoded address. The LUT uses a PCHB-style pipeline circuit that has been modified for reduced area requirements and higher speed. When the function unit is configured to perform carry computations, the XOR stage outputs the logical "xor" of the LUT output and the carry-in to produce the function unit's output.

The conditional unit can be implemented, for example, using either a two-way controlled merge process or a two-way controlled split process. The merge process is a conditional input process that operates by conditionally reading a "data" token from one of two input channels, depending ion the value of a "control" token, and sending the "data" token on an output channel. Likewise, the split process is a conditional output process that operates by conditionally sending a "data" token from one input channel to one of two output channels, depending again on the value of a "control" token.

The output copy pipeline stage is used to copy result tokens from the logic block and statically route them to the output ports of the logic block. The function unit and conditional unit can both source tokens to the output copy pipeline stage. Additionally, the input buffers can also source tokens to the output copy, which allows the logic block to support low-latency copy processes that bypass the function and conditional units.

Pipelined switch boxes are preferably built into the asynchronous FPGA interconnect to ensure high token throughput between communicating logic blocks. In the preferred embodiment, pipelined switch points are employed in such a manner that wire segments only connect to each other when they are in the same track. In the asynchronous interconnect, a channel connecting two logic blocks can be routed through an arbitrary number of pipelined switch boxes without changing the correctness of the resulting logic system because the asynchronous FPGA is slack elastic, which is to say that the pipeline depth has no effect on the logical correctness.

The foregoing architecture differs from existing architectures because it is based on high-performance custom asynchronous circuits and is not a part of an existing clocked FPGA. The result is a programmable asynchronous architecture that is an order-of-magnitude improvement over previous architectures. The main benefits of the pipelined asynchronous FPGA include:

Ease of pipelining: enables high-throughput logic cores that are easily composable and reusable, where asynchronous handshakes between pipeline stages enforce correctness (not circuit delays or pipeline depths as in clocked circuits).

Event-driven energy consumption: automatic shutdown of unused circuits (perfect "clock gating") because the parts of an asynchronous-circuit that do not contribute to the computation being performed have no switching activity.

Robustness: automatically adaptive to delay variations resulting from temperature fluctuations, supply voltage changes, and the imperfect physical manufacturing of a chip, which are increasingly difficult to control in deep submicron technologies.

Tool compatibility: able to use existing place and route CAD tools developed for clocked FPGAs.

BRIEF DESCRIPTION OF THE DRAWINGS

The features and advantages of the present invention will become apparent from the following detailed description of a number of preferred embodiments thereof, taken in conjunction with the following drawings, in which:

FIG. 5 is a block diagram illustrating the details of a function unit employed in the logic block of FIG. 4;

FIGS. 7A and 7B are logic diagrams illustrating the merge and split functions, respectively, that are implemented by the conditional unit in the FPGA of FIG. 4;

DETAILED DESCRIPTION OF THE PREFERRED EMBODIMENTS

Before a discussion of the preferred embodiments of the present invention is presented, the basic asynchronous circuits that are employed as the building blocks in the preferred embossments will be discussed. The class of asynchronous circuits employed in the preferred embodiments is known as quasi-delay-insensitive (QDI). QDI circuits are designed to operate correctly under the assumption that gates and wires have arbitrary finite delay, except for a small number of special wires known as isochronic forks that can safely be ignored for the circuits in the preferred embodiments. Although transistors can be sized to adjust circuit delays, this only affects the performance of a circuit and not its correctness. The asynchronous systems that form the preferred embodiments can be viewed as a collection of concurrent hardware processes that communicate with each other through message-passing channels. The messages that are passed through the channels consist of atomic data items called tokens. Each process can send and receive tokens to and from its environment through communication ports. Asynchronous pipelines are constructed by connecting these ports to each other using channels, where each channel is allowed only one sender and one receiver.

Figure 1:
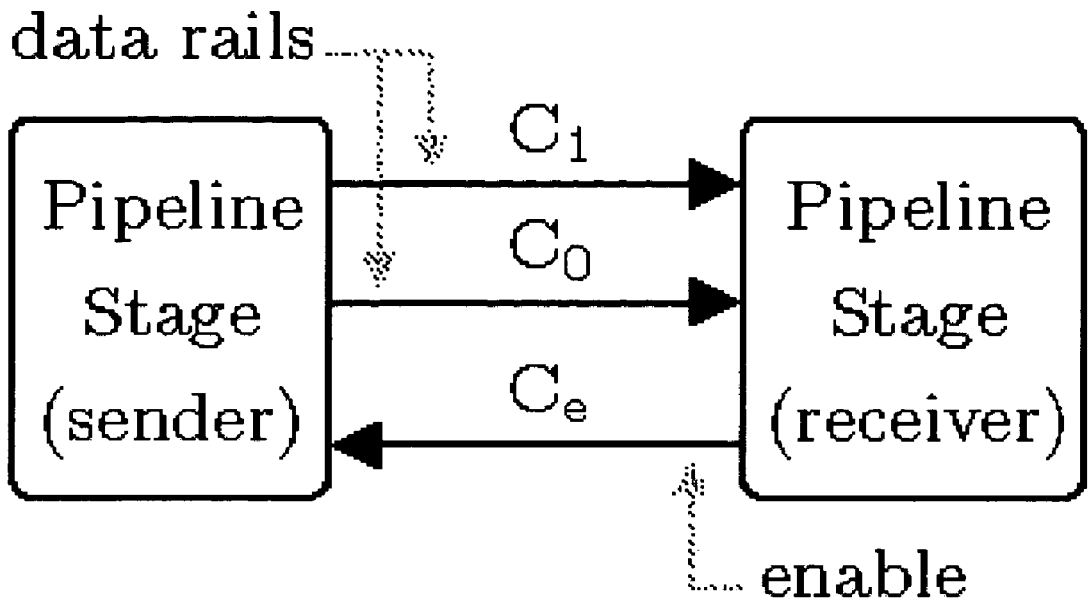
FIG. 1 is a block diagram illustrating a hand shaking technique that is employed to communicate between asynchronous pipelined logic stages in the preferred embodiments of the present invention.

Since there is no clock in an asynchronous design, the subject processes use handshake protocols to send and receive tokens on channels. In the preferred embodiments, each channel is implemented using three wires, two data wires and one enable wire, to implement a four-phase handshake protocol. This is depicted in FIG. 1, which shows the communication protocol between a sender pipeline stage and a receiver pipeline stage. The data wires or rails $C_1$ and $C_0$ encode bits using a dual-rail code, such that setting $C_0$ transmits a "logic-0" and setting $C_1$ transmits a "logic-1". A dual-rail encoding is a specific example of a "1 of N" asynchronous signaling code that uses N wires to encode N values, such that setting the nth wire encodes data value n. The four-phase protocol operates as follows: the sender sets one of the data wires, the receiver latches the data and lowers the enable wire $C_e$, the sender lowers all data wires, and finally the receiver raises the enable wire $C_e$ when it is ready to accept new data. The cycle time of a pipeline stage is the time required to complete one four-phase handshake. The throughput, or the inverse of the cycle time, is the rate at which tokens travel through the pipeline.

High-throughput, fine-grain pipelined circuits are critical to efficiently implementing logic in an asynchronous FPGA architecture. Fine-grain pipelines contain only a small amount of logic (e.g., a 1-bit adder) and combine computation with data latching, removing the overhead of explicit output registers. Asynchronous, fine-grain pipeline stages perform one or more of the following dataflow operations: (1) compute arbitrary logical functions, (2) store state, (3) conditionally receive tokens on input channels, (4) conditionally send tokens on output channels, and (5) copy tokens to multiple output channels. As will be discussed in greater detail later, the asynchronous FPGAs disclosed herein have a function unit to compute arbitrary functions and use feedback loops to store state. However, because operations 3, 4, and 5 involve tokens they are inherently asynchronous pipeline structures. The asynchronous FPGA architectures provide a conditional unit for conditionally receiving or sending tokens and an output copy unit for copying tokens. Since a clocked FPGA circuit has no concept of a token, it uses multiplexers, demultiplexers and wire fan-out to implement structures similar to operations 3, 4 and 5, respectively. The main difference is that these clocked circuits are destructive (i.e., wire values not used are ignored and overwritten on the next cycle), whereas an asynchronous circuit is nondestructive (i.e., tokens remain on channels until they are used).

Figure 2A:
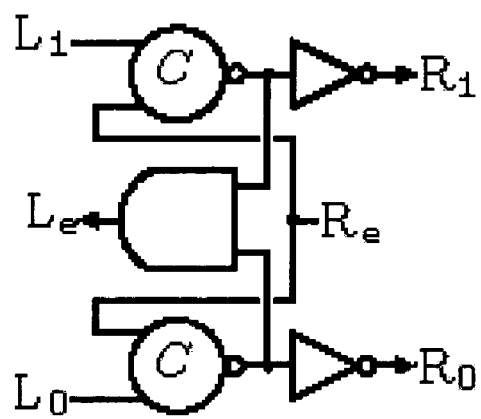
FIGS. 2A and 2B are a logic circuit diagram and a block diagram equivalent thereof, respectively, of a first pipeline stage known as a weak-condition half-buffer that is employed to implement elements in an FPGA constructed in accordance with the preferred embodiments.
Figure 2B:
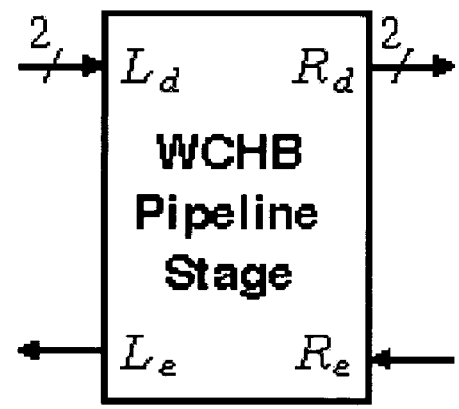
Figure 2C:
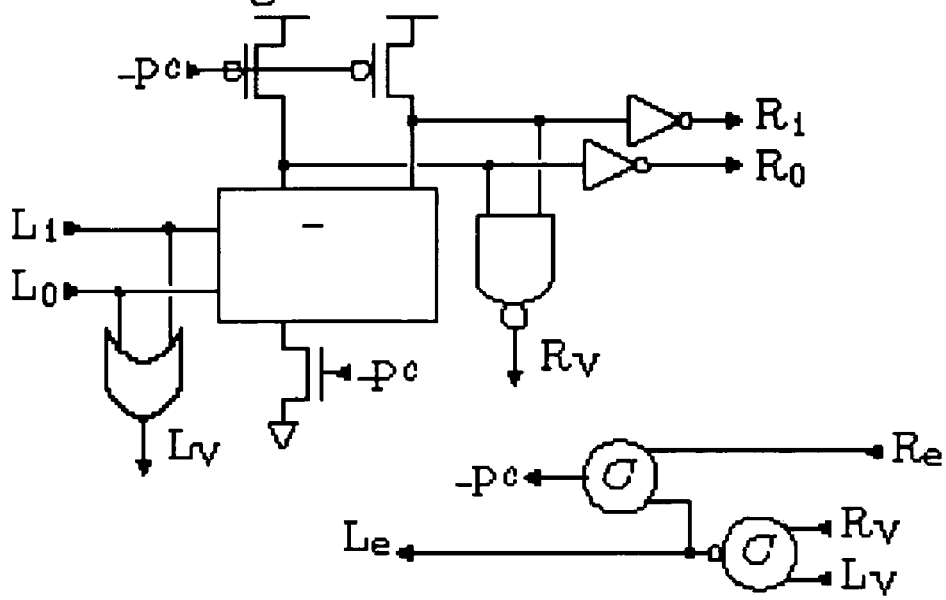
FIGS. 2C and 2D are a logic circuit diagram and a block diagram equivalent thereof, respectively, of a second pipeline stage known as a precharge half-buffer that is also employed to implement elements in an FPGA constructed in accordance with the preferred embodiments.
Figure 2D:
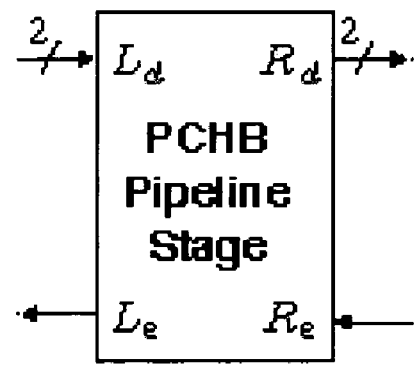

FIGS. 2A–2D show two known types of asynchronous pipeline stages that are used in the asynchronous FPGAs constructed in accordance with the preferred embodiments of the invention. Each of the stages is constructed from a collection of known types of logic gates and transistors as illustrated. FIGS. 2A and 2B specifically show a weak-condition half-buffer (WCHB) pipeline stage, which is the smaller of the two circuits and is useful for token buffering and token copying. The half-buffer notation indicates that a handshake on the receiving channel, L, cannot begin again until the handshake on the transmitting channel, R, is finished. FIGS. 2C and 2D illustrate a precharge half-buffer (PCHB) pipeline stage which has a precharge pull-down stack that is optimized for performing fast token computations. Since WCHB and PCHB pipeline stages have the same dual-rail channel interfaces, they can be composed together and used in the same pipeline.

It should be noted that the C-elements in the circuits of FIGS. 2A and 2C are each an asynchronous state-holding circuit that goes high when all its inputs are high and goes low when all its inputs are low. It should also be understood that while the preferred embodiments employ WCHB and PCHB pipeline stages, other circuits could also be employed, as long as they employ token passing channels and handshaking based flow control. Examples of other suitable circuits include "GasP" pipeline stages, "bundled data" pipeline stages and "pulse logic" pipeline stages.

Figure 3A:
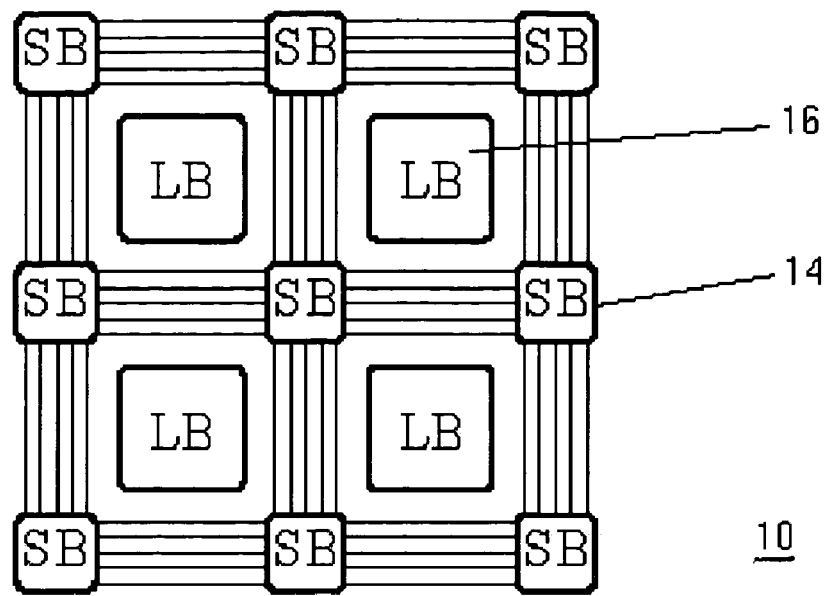
FIG. 3A is a block diagram illustrating the island style architecture of an asynchronous FPGA constructed in accordance with a first preferred embodiment of the present invention.
Figure 3B:
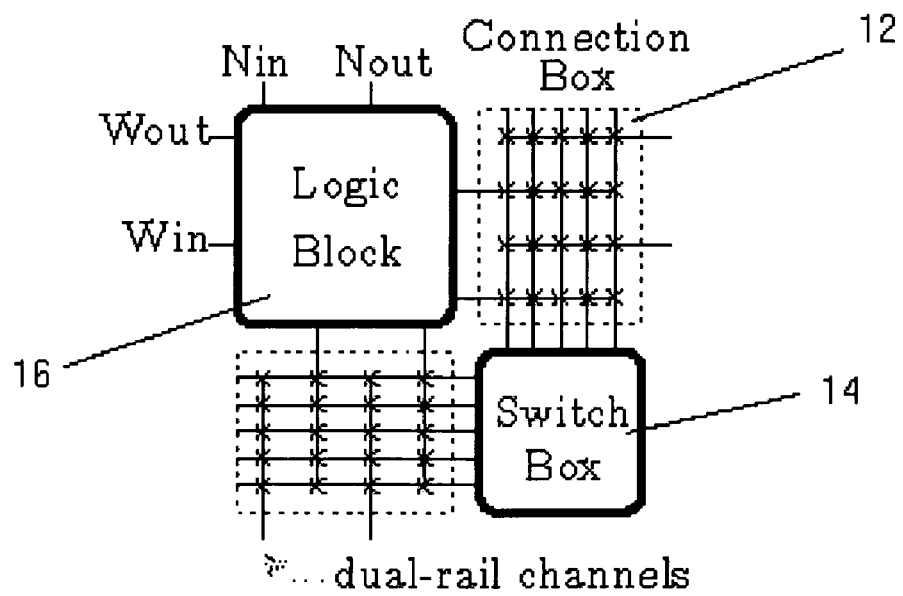
FIG. 3B is a block diagram illustrating the details of connection boxes that are employed in the architecture of FIG. 3A.

Asynchronous pipelines can be used in programmable logic applications by adding a switched interconnect between its pipeline stages, which configures how their channels connect together. FIG. 3A shows a portion of an asynchronous FPGA 10 that is constructed in accordance with a first preferred embodiment of the present invention and uses such a programmable interconnect. As shown in the more detailed illustration of FIG. 3B, a plurality of connection boxes 12 and switch boxes 14 are used to connect channels between an array of logic blocks 16. However, the throughput of an asynchronous pipeline is severely degraded if its channels are routed through a large number of non-restoring switches. As a result and as will be discussed in further detail later, the pipelined interconnect architecture of the present invention uses pipelined switch boxes and guarantees at most two non-restoring switches between pipeline stages. This ensures a high throughput asynchronous FPGA and minimizes the performance lost due to using a switched interconnect.

One notable characteristic of the asynchronous FPGAs constructed in accordance with the preferred embodiments is that they are slack elastic. A slack-elastic system has the property that increasing the pipeline depth, or slack, on any channel will not change the logical correctness of the original system. This property allows a designer to locally add pipelining anywhere in the slack-elastic system without having to adjust or resynthesize the global pipeline structure of the system (although this can be done for performance reasons, it is not necessary for correctness). While many asynchronous systems are slack elastic, any non-trivial clocked design will not be slack elastic because changing local pipeline depths in a clocked circuit often requires global retiming of the entire system. Use of slack elastic FPGAs simplifies logic synthesis and channel routing by allowing logic blocks and routing interconnects to be implemented with a variable number of pipeline stages, whose pipeline depth is chosen for performance and not because of correctness. More importantly, in a pipelined interconnect, the channel routes can go through an arbitrary number of interconnect pipeline stages without affecting the correctness of the logic. The logic mapped to a slack-elastic FPGA need not be aware of the depth of the logic block pipelining or the length of its channel routes, since it will operate correctly regardless of how many pipeline stages exist. This property is referred to as self-pipelining because the designer only specifies the functionality and connectivity of the logic, but does not explicitly specify the pipeline details. A slack-elastic FPGA has an increased amount of flexibility over a clocked FPGA, where pipeline depths must be deterministic and specified exactly for the logic to function correctly. For example, the pipelined asynchronous FPGAs yield good performance without requiring banks of retiming registers, which are necessary for logical correctness in highly pipelined clocked FPGA architectures. In addition, simple place and route tools can be employed that do not need knowledge of logic block pipeline depths, pipelined interconnects or even asynchronous circuits.

Referring again to FIGS. 3A and 3B, the asynchronous FPGA 10 has "island-style" architecture with the pipelined logic blocks 16, pipelined switch boxes 14 and unpipelined connection boxes 12. In this preferred embodiment, each logic block 16 has four inputs and four outputs, equally distributed on its north, east, south and west edges. The routing tracks are dual-rail asynchronous channels and span only single logic blocks. Preferably, the connection boxes are fully-populated and the switch boxes have Xilinx-style routing capabilities. Configuration of the asynchronous FPGA 10 is preferably done using clocked SRAM-based circuitry. This allows the same configuration schemes to be used that are used in clocked FPGAs. In this design, the simplest configuration method was constructed using shift-register type configuration cells that are connected serially throughout the circuit chip. During programming the asynchronous portion of the logic is held in a passive reset state while the configuration bits are loaded. The configuration clocks are disabled after programming is complete and the asynchronous logic is enabled.

Figure 4:
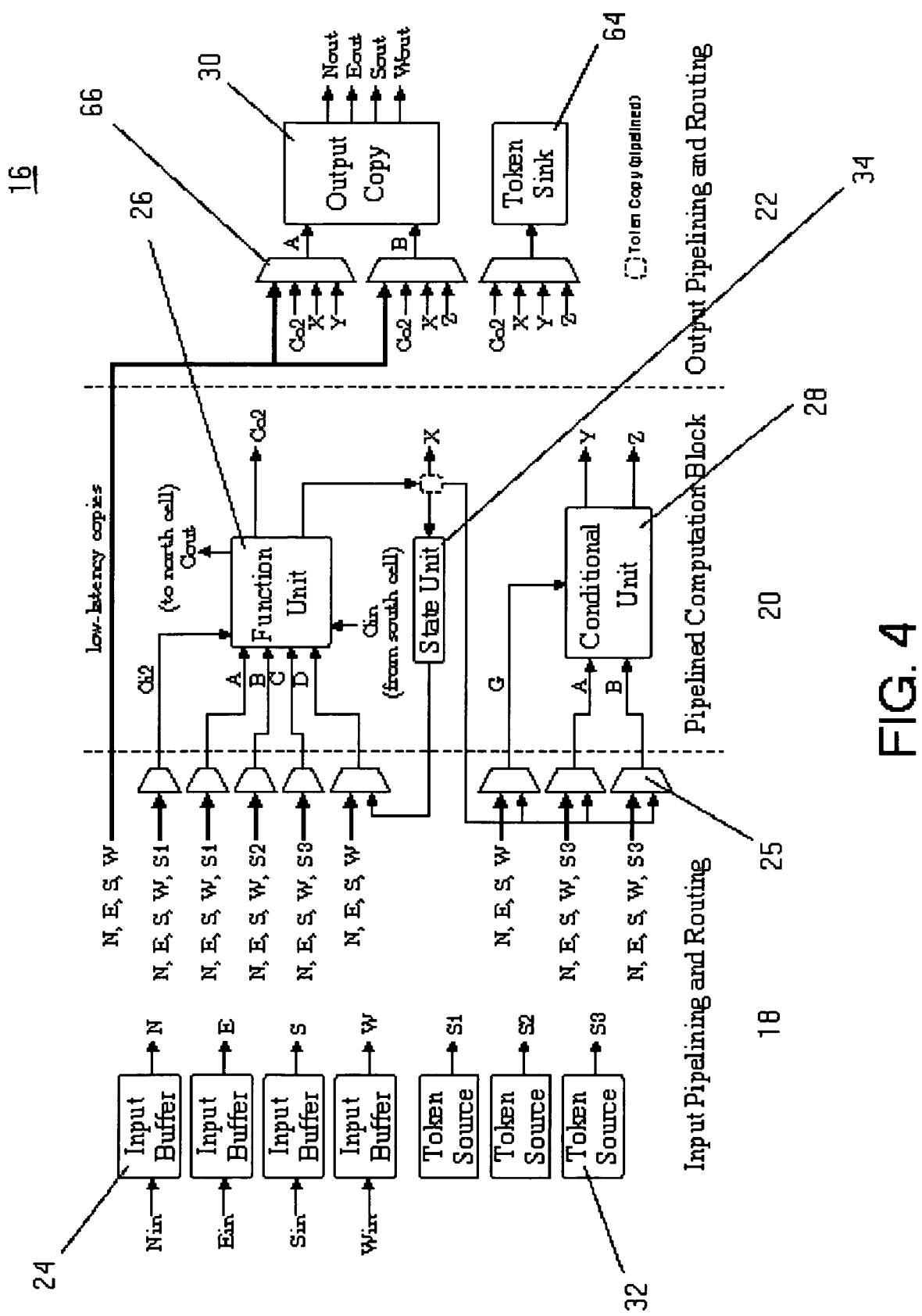
FIG. 4 is a block diagram illustrating an asynchronous logic block that is employed in the FPGA of FIG. 3A.

The pipelined architecture of one of the logic blocks 16 for the asynchronous FPGA 10 is shown in FIG. 4. The main parts of the logic block 16 are the input pipelining and routing 18, the pipelined computation block 20, and the output pipelining and routing 22.

The input pipelining and routing 18 includes a plurality of input buffers 24. These are formed from single WCHB pipeline stages and buffer input tokens from the connection box 12 switches and the mux switches 25 which are used to route the logic block inputs to a function unit 26, a conditional unit 28, or an output copy unit 30 of the logic block 16. Upon system reset, the input buffers 24 can optionally initialize the internal logic block channels (N, E, S, W) with tokens, which is often necessary in an asynchronous system to setup token-ring pipelines and other state-holding pipelines. Three constant token sources 32 can also be routed to any of the function or conditional unit inputs A, B, C or D.

The pipelined computation block 20 includes the aforementioned function unit 26 and conditional unit 28, as well as a state unit 34. The function unit 26, which is pipelined and fully asynchronous, is shown in detail in FIG. 5 and can implement any function of four variables, as well as provide support for efficient carry generation in addition and multiplication applications. The main pipeline of the function unit 26 consists of an address decoder 40, a lookup table (LUT) 42 and an XOR output stage 44. A secondary pipeline, which is optionally configured when carry computations are necessary, examines the function unit inputs A and B and generates the carry-out Cout. This pipeline is implemented with an AND logic circuit 46 and first and second multiplexer switches 48 and 50. The output of the function unit 26 can be copied to the output copy 30, to the state unit 34, and/or to the conditional unit 28. The address decoder 40 reads the four function unit inputs A, B, C and D and generates a 1 of 16 encoded address. The 1 of 16 encoding on the address channel simplifies indexing into the LUT 42 and is the only asynchronous channel in the design that is not dual-rail encoded.

Figure 6:
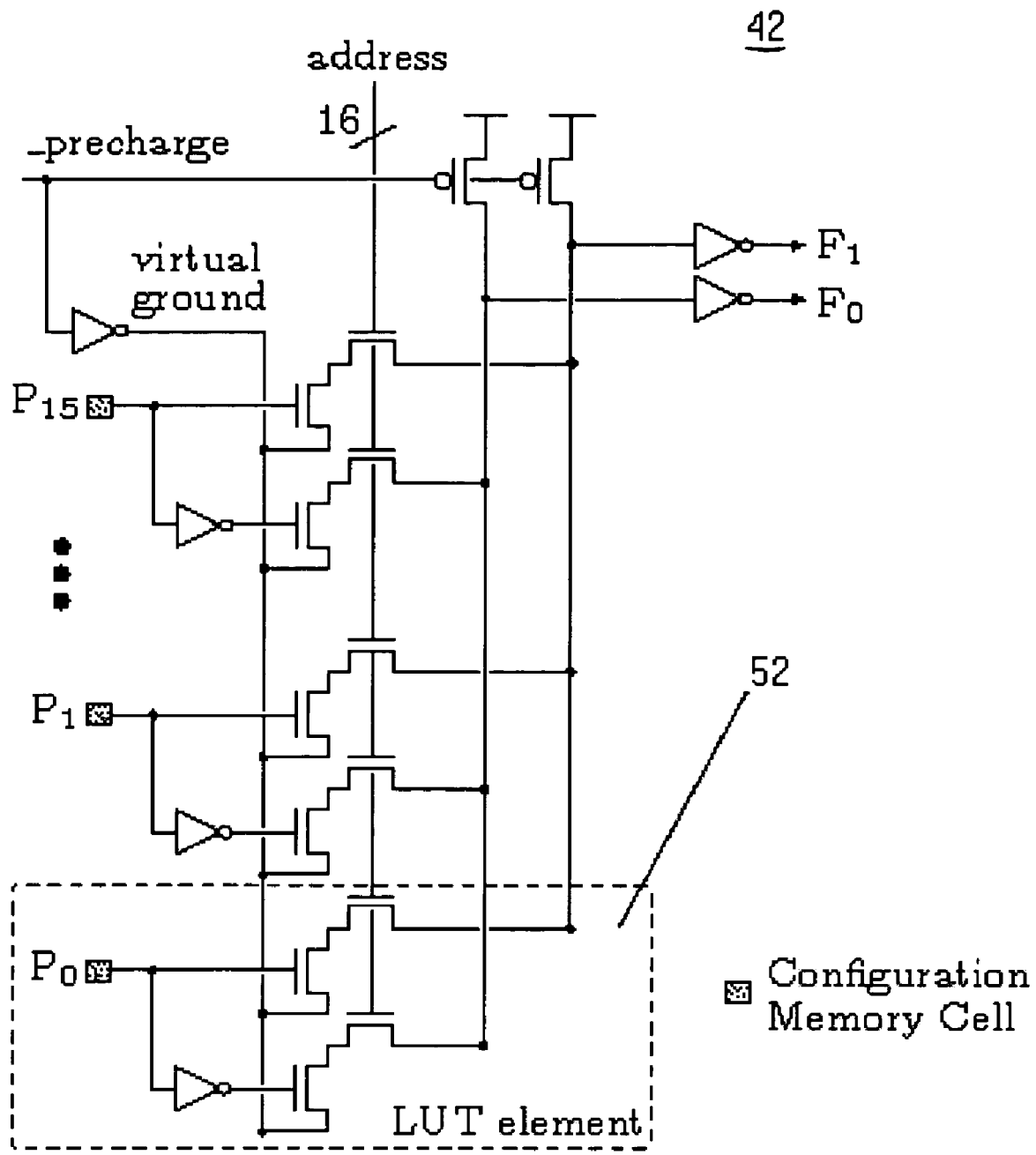
FIG. 6 is a circuit diagram illustrating a circuit employed to implement the lookup table in the FPGA of FIG. 4.

The asynchronous four-input circuit that is used to implement the LUT 42 is shown in FIG. 6 and uses a modified PCHB-style pipeline circuit (the handshake control circuit is not shown). The LUT 42 is comprised of 16 transistor-based memory elements or cells 52. Since there are sixteen of the memory elements 52 in the four-input LUT 42 and the 1 of 16-encoded address guarantees no sneak paths will occur in the pull-down stack, the asynchronous LUT circuit can use a virtual ground generated from the "precharge" signal instead of the foot transistors used in a normal PCHB pipeline stage. This reduces the number of series transistors employed in the circuit and eliminates the need for internal-node precharging circuitry to compensate for charge sharing issues, thereby reducing the area required for the LUT 42 and increasing its speed. The address decode and function lookup table circuits are the throughput limiting part of the pipelined asynchronous FPGA 10, and the transistors in a prototype of these circuits were sized to operate at 400 MHz in TSMC 0.25 μm. When the function unit 26 is configured to perform carry computations, the XOR stage 44 outputs the logical "xor" of the LUT output and the carry-in to produce the function unit's output. A carry computation would require two LUTs if the function unit 26 did not have this extra built-in XOR stage 44. However, adding an additional pipeline stage to the function unit 26 increases the input-to-output latency on its critical pipeline path.

To evaluate the performance impact of this pipeline stage, an unpipelined version of the XOR stage 44 was designed that has minimal latency when it is configured not to use the carry-in. The performance of the unpipelined XOR was measured on typical pipelined designs mapped to the subject asynchronous FPGA architecture and compared against the performance of the proposed pipelined XOR stage. For linear pipeline designs, the pipelined XOR stage was 20% faster in throughput, but with token-ring pipelines, the unpipelined XOR stage was 8% faster. Thus, by using the pipelined XOR stage 44, one trades slightly decreased token-ring performance for greatly increased linear pipeline performance.

The carry pipeline in the function unit 26 is used to create carry chains for arithmetic computations. The AND stage 46 either propagates the A input to the CMUX stage 48 for addition carry chains or outputs the logical "and" of the A and B inputs to the CMUX stage 48 for multiplication carry chains. Depending on the value of the LUT output, the CMUX stage 48 generates the carry-out by selecting between the carry-in and the output of the AND stage 46. When the carry-out does not depend on the carry-in and the CMUX stage 48 has received a token from the AND stage 46, it does not need to wait for the carry-in token to generate the carry-out token. This early-out CMUX allows the construction of asynchronous ripple-carry adders that exhibit average-case behavior in their carry chains. In contrast, clocked ripple-carry adders must tolerate the worst-case behavior of their carry chains. Carry chains can be routed using the normal interconnect or using low latency carry channels that run vertically south-to-north between adjacent vertical logic blocks.

The conditional unit 28 allows logic processes to conditionally send tokens on output channels or to conditionally receive tokens on input channels. The conditional unit 28 is heavily used in control dominated asynchronous circuits and less so in other computation circuits. FIGS. 7A and 7B show the two possible configurations for the conditional unit: 28 a two-way controlled merge process or a two-way controlled split process. The merge process is a conditional input process that operates by reading a "control" token on the G channel, conditionally reading a "data" token from A (if the "control" token equals zero) or from B (if the "control" token equals one), and finally sending the "data" token on the Y output channel. Likewise, the split process is a conditional output process that operates by reading a "control" token on the G channel, reading a "data" token on the A channel, and then conditionally sending the "data" token on Y (if the "control" token equals zero) or on Z (if the "control" token equals one). The asynchronous merge and split processes are similar to clocked multiplexers and demultiplexers, which operate on signals instead of tokens. The conditional unit 28 is only slightly larger than a standard two-way asynchronous merge process.

Figure 8A:
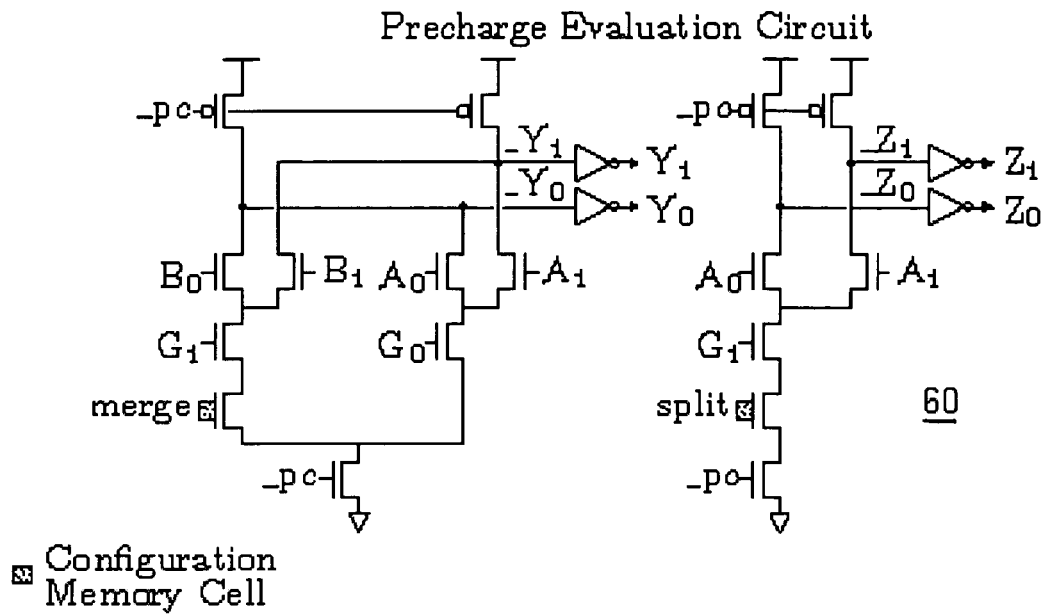
FIGS. 8A and 8B are circuit diagrams illustrating the precharge evaluation circuit and the hand shake control circuit, respectively, that are employed to implement the conditional unit in the FPGA of FIG. 4.
Figure 8B:
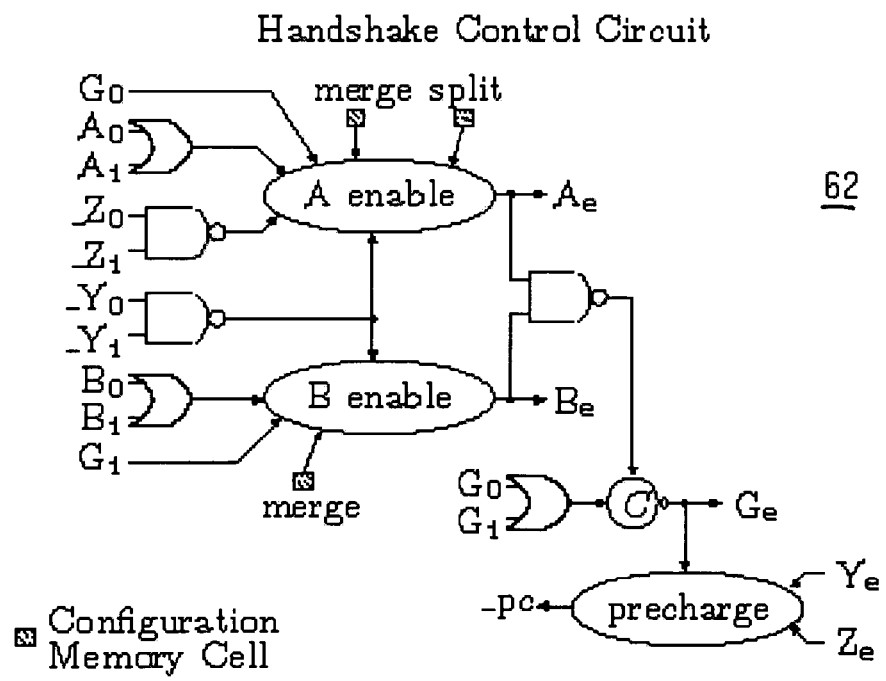

FIG. 8A shows a precharge evaluation circuit 60 that Is specifically employed to implement the conditional unit 28, while FIG. 8B shows a handshake control circuit 62 that is also employed in the conditional unit 28. The handshake control circuit 62 is much more complex than for a normal PCHB-style pipeline stage and is the reason why one cannot simply make all channels conditional in the logic block. By using the same precharge transistor stacks and handshake control circuits for both the merge and split processes, the area of the conditional unit 28 is approximately 40% smaller than if the design used separate split and merge circuits, such as the design of the second preferred embodiment to be discussed in conjunction with FIGS. 13–15.

Referencing again FIG. 4, the output pipelining and routing section 22 includes the output copy pipeline stage 30, a token sink 64 and a trio of input mux switches 66 for selecting the inputs to the output copy stage 30 and the token sink 64. The output copy pipeline stage 30 performs both token copying and token routing. This stage is used to copy result tokens from the logic block 16, which arrive on channels A and B, and statically route them to the four output ports (Nout, Eout, Sout, Wout) of the logic block 16. The output copy stage 30 can support at most two concurrent copy processes (with input channels A and B respectively) that copy tokens to 1, 2, 3 or 4 of the output ports, with the restriction that the output ports cannot be shared between the two copy processes. Sharing output ports is not allowed because the same channel would have two token senders, which is equivalent to having two competing drivers in a clocked circuit.

As shown in FIG. 4, the function unit 26 and the conditional unit 28 can both source tokens to the output copy pipeline stage 30. The input buffers 24 can also source tokens to the output copy stage 30, which allows the logic block 16 to support low-latency copy processes that bypass the function and conditional units 26 and 28. However, since the output copy stage 30 has only two input channels, the output copy stage 30 can handle at most two token streams. Result tokens that are not needed by other logic blocks should therefore be routed to the token sink 64 instead of the output copy stage 30.

Figure 9:
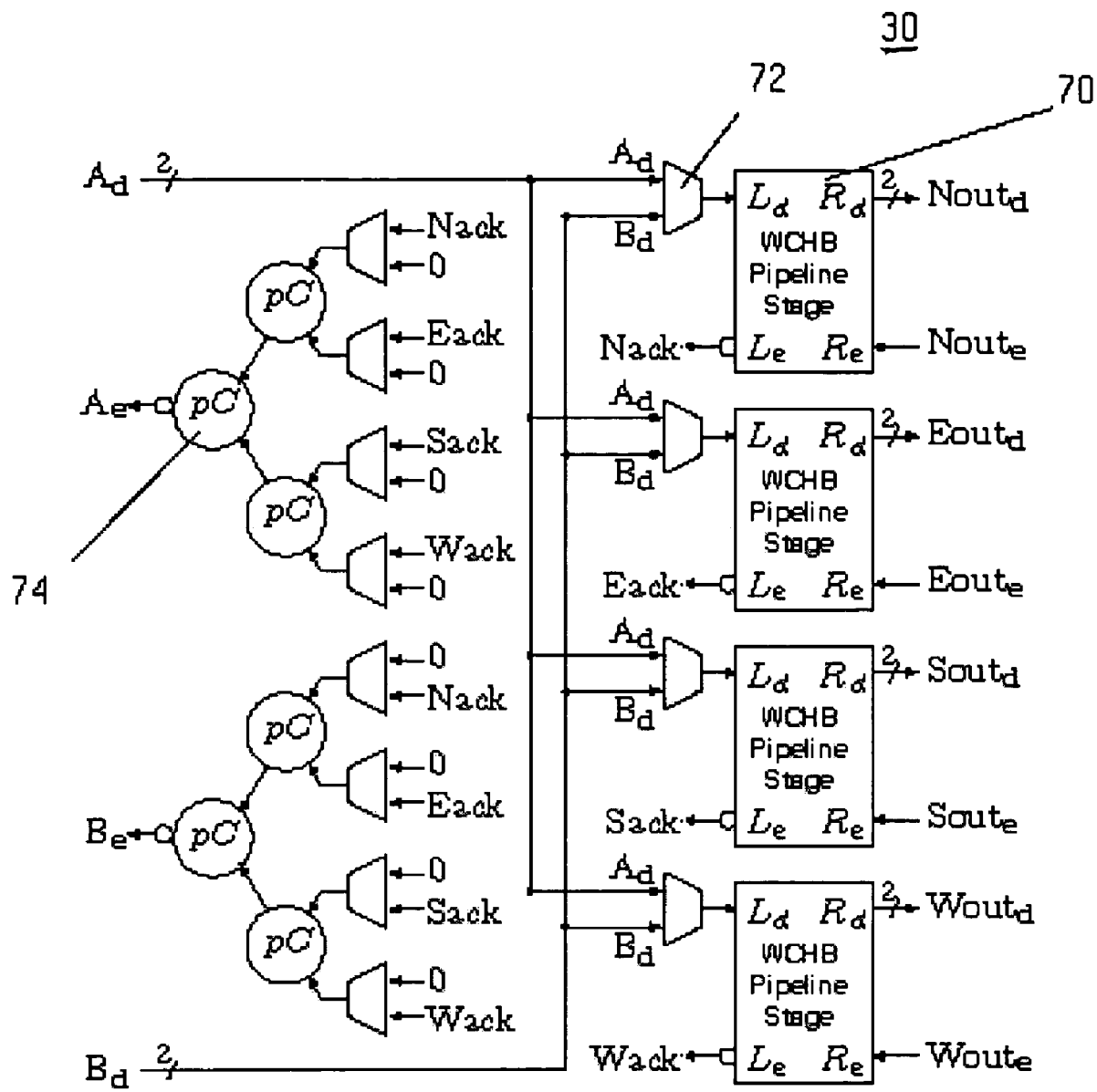
FIG. 9 is a block diagram illustrating an output copy circuit that is employed in the FPGA of FIG. 4.

The circuit that implements the output copy stage 30 is shown in FIG. 9. As shown, the output copy stage 30 is formed form a plurality of WCHB pipeline stages 70 and a plurality of mux switches 72. It is important to note that after the muxes in the output copy stage circuit have been configured by the configuration memory, the output copy stage circuit operates as two completely independent and concurrent copy processes.

Figure 10:
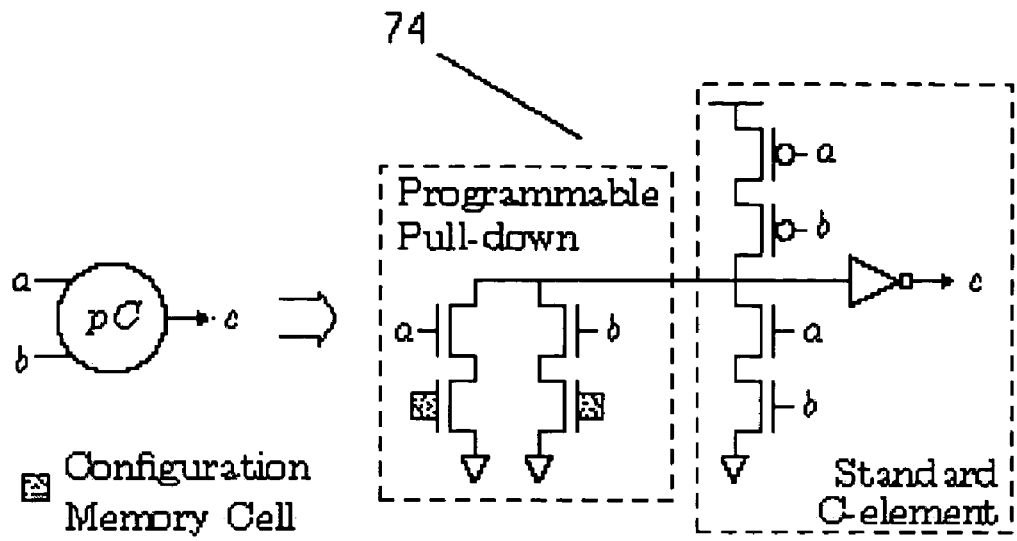
FIG. 10 is a circuit diagram illustrating a programmable C element that is employed in the copy circuit of FIG. 9.

The circuit of FIG. 9 employs a number of programmable C-elements (pC) 74. FIG. 10 shows the circuit details for a pC 74, which consists of a standard C-element augmented by a configurable pull-down stack that allows a and/or b to be ignored when pC is part of a completion tree. The environment is responsible for driving unused inputs to ground.

Referencing once again FIG. 4, the state unit 34 is a small pipeline built from two WCHB stages that feeds the function unit output back as an input to the function unit 26, forming a fast token-ring pipeline. Upon system reset, a token is generated by the state unit 34 to initialize this token-ring. This state feedback mechanism is superior to the design in the second preferred embodiment where all feedback rings needed to be routed through the global interconnect.

Figure 11:
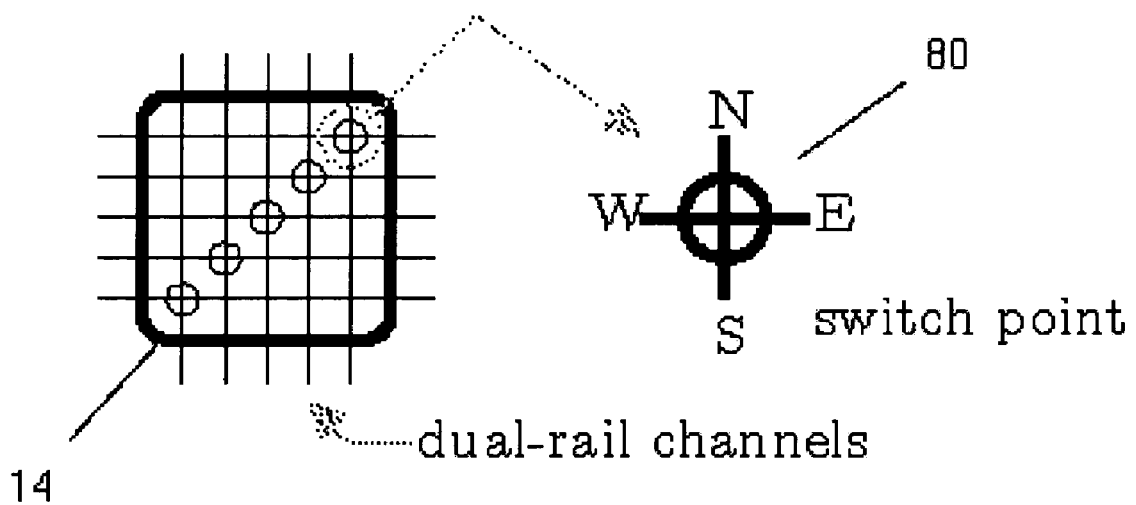
FIG. 11 is a block diagram illustrating the switch points in one of the switch boxes shown in FIG. 3B.
Figure 12:
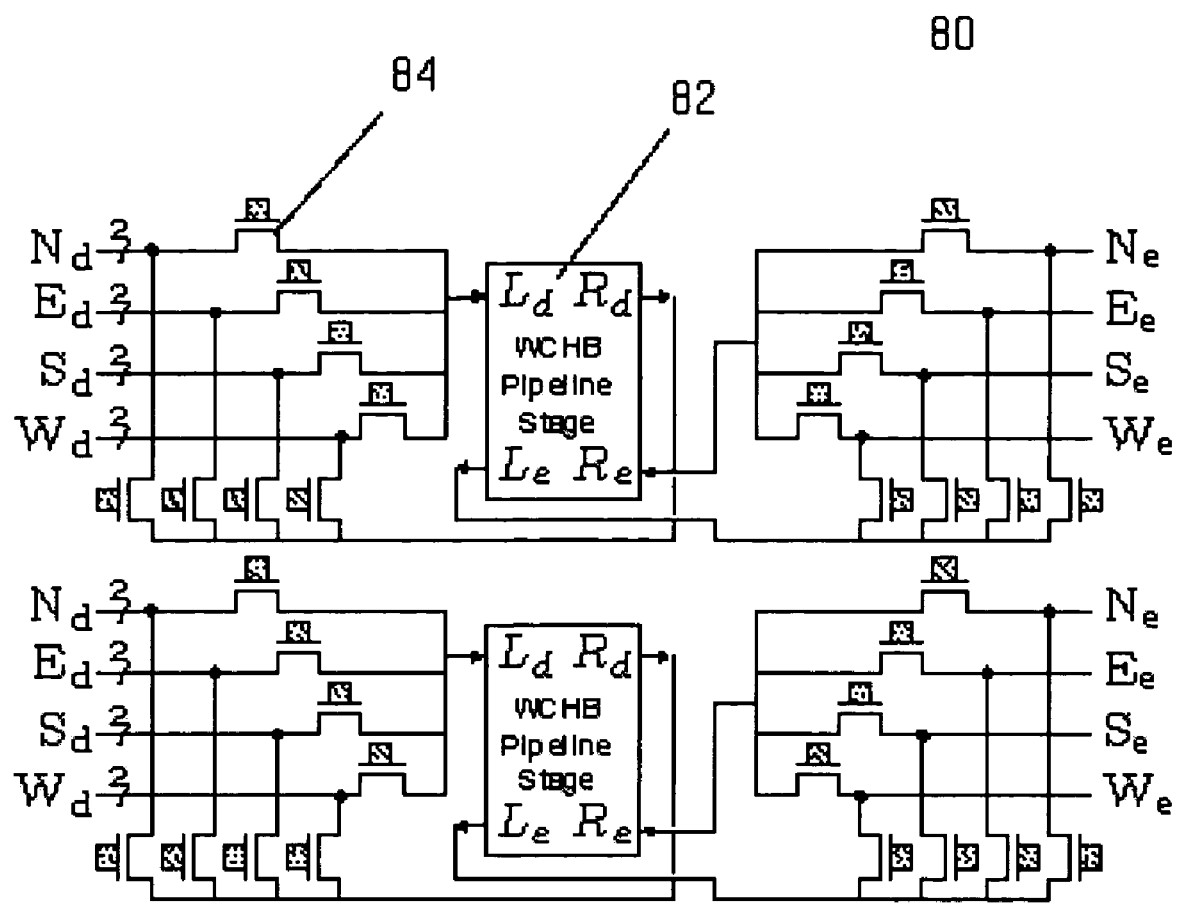
FIG. 12 is a circuit diagram illustrating the details of one of the switch points shown in FIG. 11.

The pipelined switch boxes 14 (see FIG. 3B) are built into the asynchronous FPGA interconnect to ensure high token throughput between communicating logic blocks. FIG. 11 shows the switch points 80 of one of the switch boxes 14, while FIG. 12 shows the details of one of these pipelined switch points 80 that is formed form a pair of WCHB pipeline stages 82 and an array of transistor switches 84. The switch point 80 is arranged such that wire segments only connect to each other when they are in the same track. This is similar to the switch points used in high-speed clocked FPGAs. In the asynchronous interconnect, a channel connecting two logic blocks can be routed through an arbitrary number of pipelined switch boxes without changing the correctness of the resulting logic system since the asynchronous FPGA is slack elastic. However, the system performance can still decrease if a channel is routed through a large number of switch boxes.

Figure 13:
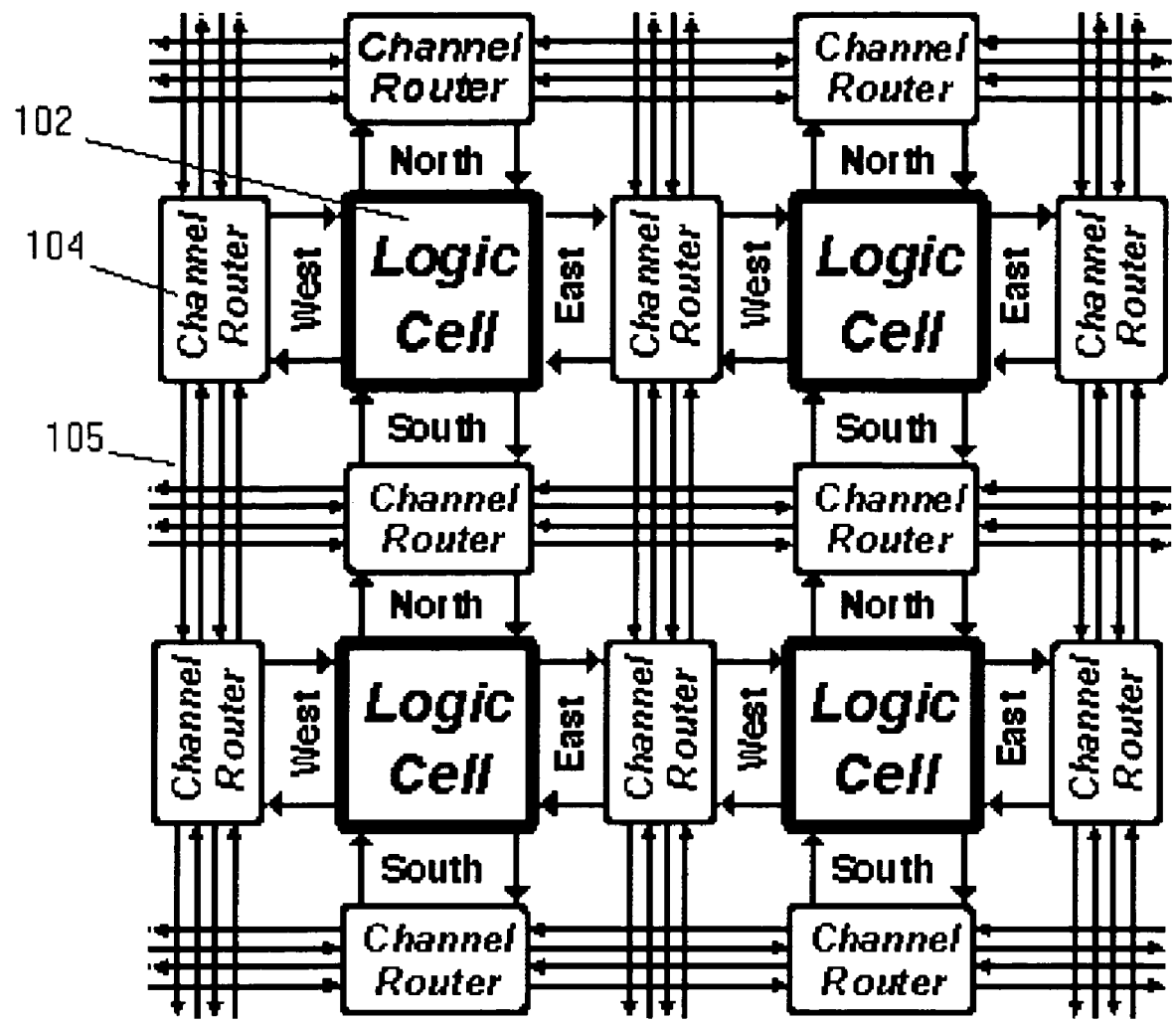
FIG. 13 is a block diagram illustrating the architecture of an asynchronous FPGA constructed in accordance with a second preferred embodiment of the present invention.
Figure 14:
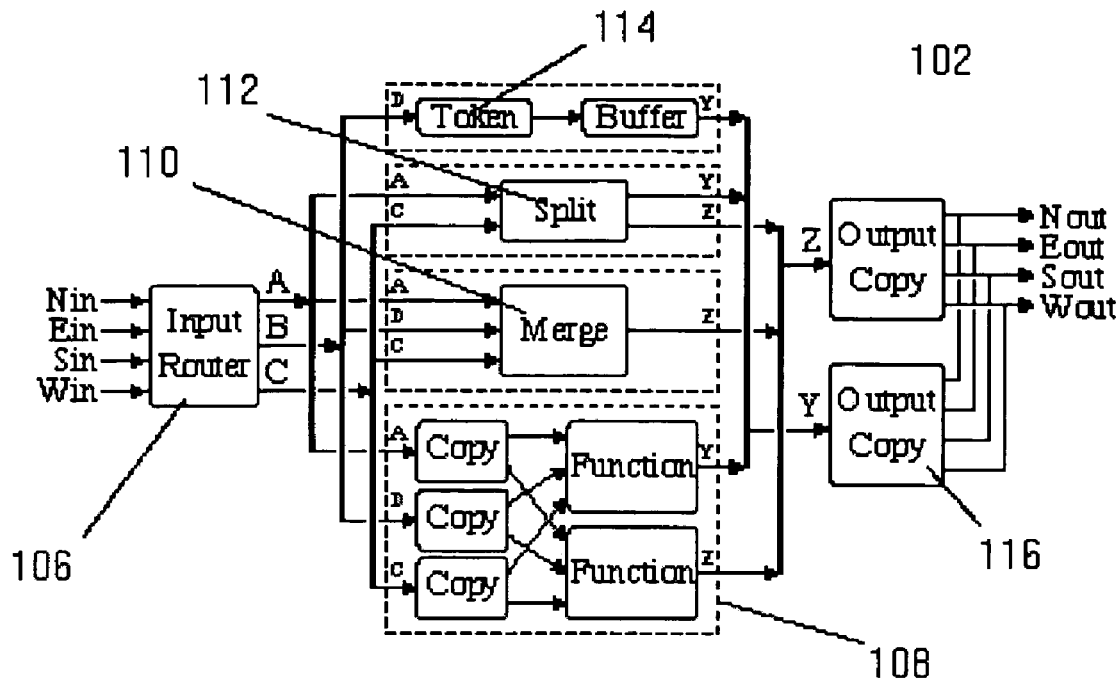
FIG. 14 is a block diagram illustrating the details of a logic cell used in the FPGA of FIG. 13.

A second preferred embodiment of an asynchronous FPGA is illustrated in FIGS. 13 and 14. In this embodiment, an FPGA 100 consists of an array of logic blocks or cells 102 that are surrounded by a plurality of channel routers 104. The logic cells 102 communicate through 1-bit wide, dual-rail encoded channels 105 that have programmable connections configured by the channel routers 104.

With reference to FIG. 14, the details of one of the logic cells 102, which are similar to those of the logic block 16 in the first embodiment, are illustrated. An input router 106 routes channels from the physical input ports Nin, Ein, Sin and Win to three internal logical input channels A, B and C. The router 106 is implemented as a switch matrix and is unpipelined. If an internal input channel is not driven from a physical input port, a token with a "logic-1" value is internally sourced on the channel (not shown). The internal input channels are shared between four logical units, of which only one unit can be enabled. The logic cell 102 includes a function unit 108, a merge unit 110, a split unit 112, a token unit 114 and a pair of output copy units 116.

In this embodiment, the function unit 108 is formed with two pipeline stages and carries out two arbitrary functions of three variables such that the unit 108 implements a 1-bit full adder. The function unit 108 receives tokens on channels A, B and C and sends function results on output channels Y and Z.

The merge unit 110 and split unit 112 serve the same function as the conditional unit 28 in the FIG. 4 embodiment. The merge unit 110 is formed form one pipeline stage and performs a two-way controlled merge. The unit 110 receives a control token on channel C. If the control token equals "logic-0" it reads a data token from channel A, otherwise it reads a data token from channel B. The data token is sent on channel Z. Similarly, the split unit 112 is also formed from one pipeline stage and performs a two-way controlled split. The unit 112 receives a control token on channel C and a data token on channel A. If the control token equals "logic-0" it sends the data token on channel Y; otherwise it sends the data token on channel Z.

The token unit 114 is used for state initialization and is formed from two pipeline stages. Upon system reset a token (with a programmable value) is sent on channel Y. Afterwards the unit 114 acts as a normal pipeline (i.e., it receives a token on channel B and sends it on channel Y). Unlike most existing FPGA architectures, the asynchronous FPGA 100 does not have internal state feedback. Instead, state feedback logic is synthesized with an external feedback loop through the token unit 114. This ensures that the state feedback loop is pipelined and operates at close to full throughput without adding additional area overhead to the logic cell to support an internal feedback path.

The output copy units 116 copy result tokens from channels Y and Z to one or more physical output ports Nout, Eout, Sout and Wout or sinks the result tokens before they reach any output port.

The FPGA 100 uses 44 configuration bits to program its logic. The configuration bits are distributed as follows: 15 bits for the input router 106, 4 bits for the logic block enables, 16 bits for the function unit 108, 1 bit for the token unit 114, and 8 bits for the output copy units 116.

Referencing again to FIG. 13, the channel router 104 is an unpipelined switch matrix that statically routes channels between logic blocks. The channel routers 104 route all channels on point-to-point pathways and all routes are three wires wide (necessary to support the dual-rail channel protocol). Each channel router 104 has 12 channel ports (6 input and 6 output) that can route up to six channels. Four of the ports are reserved for connecting channels to adjacent logic blocks and the remaining ports are used to route channels to other of the channel routers 104. To keep the configuration overhead manageable, the channel routers 104 do not allow "backward" routes (i.e., changing a channel's route direction by 180 degrees) and each require 26 configuration bits.

The logic block and channel router interconnect topology of FIG. 13 represents a good tradeoff between performance, routing capability and cell area. However, no claim is made that it is the most optimal for this style of programmable asynchronous circuits and in fact it has several limitations. For example, it is not possible to directly route a channel diagonally on a 3×3 or larger FPGA grid using only channel routers (routing through one logic cell is required, which will improve performance for long routes). However, since most asynchronous logic processes communicate across short local channels, this long-diagonal route limitation has not been found to be overly restrictive. More complicated channel routing configurations (such as those used in clocked FPGAs) could be adapted for the subject architecture, with the added cost of more configuration bits and cell area.

Figure 15:
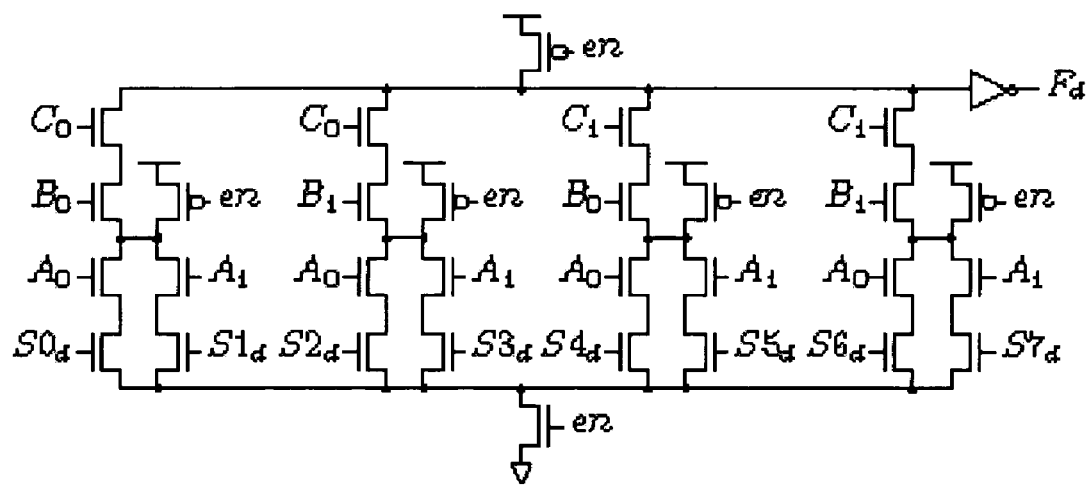
FIG. 15 is a circuit diagram illustrating one rail of a dual-rail precharge computation block for the three-input function unit employed in the logic cell of FIG. 14.

A partial circuit used in the evaluation part of the function unit 108 is shown in FIG. 15, which represents one rail of a dual-rail precharge computation block for a 3-input function unit. A, B and C are the input channels and S0$d$ . . . S7$d$ are the configurations bits that program the function result $F_d$, where d specifies the logic rail (e.g., d=0 computes F0). Although a function computation block of this style will suffer from charge sharing problems, this can be solved using aggressive transistor folding and internal-node precharging techniques.

To determine the sensitivity of channel route lengths on pipelined logic performance, tests were conducted in which the number of switch boxes was varied along a route for typical asynchronous pipelines. The performance of a branching linear pipeline using pipelined switch boxes and the FPGA logic blocks configured as function units was evaluated. Tokens are copied in the first logic block, travel through both branches of the pipeline, and join in a second logic block. Since the speed of the function unit is the throughput-limiting circuit in the subject asynchronous FPGA design, this pipeline topology gives an accurate measure for linear pipeline performance. The tests showed that an asynchronous pipelined interconnect can tolerate a relatively large pipeline mismatch (4–5 switch boxes) before the performance begins to gradually degrade. This indicates that as long as branch pathways have reasonably matched pipelines, it is not necessary to exactly balance the length of channel routes with a bank of retiming registers. In contrast, in clocked FPGAs it is necessary for correctness to exactly retime synchronous signals routed on pipelined interconnects using banks of retiming registers.

The performance trends for token-ring pipelines using the FPGA logic blocks configured as function units, such that one token is traveling around the ring, was also evaluated. For pipelined interconnects, adding switch box stages to a token-ring will decrease its performance which indicates that the routes of channels involved in token-rings should be made as short as possible. In a worst case scenario, all the logic blocks are configured with their function units enabled, thus requiring a token to travel through five pipeline stages per logic block. If the logic blocks are instead configured to use the conditional unit or the low-latency copies, then the token-ring performance would approach the performance of a linear pipeline because a token would travel through fewer pipeline stages. In addition, token rings used to hold state variables can often be implemented using the state unit, which localizes the token ring inside the logic block and has the same throughput as a linear pipeline.

Logic synthesis for the asynchronous FPGAs would follow similar formal synthesis methods to those used in the design of full-custom asynchronous circuits. One begins with a high-level sequential specification of the logic and applies semantics-preserving program transformations to partition the original specification into high-level concurrent function blocks. The function blocks are further decomposed into sets of fine-grain, highly concurrent processes that are guaranteed to be functionally equivalent to the original sequential specification. To maintain tight control over performance, this decomposition step is usually done manually in full-custom designs. However, for FPGA logic synthesis, a concurrent dataflow decomposition method has been developed that automatically produces fine-grain processes by detecting and removing all unnecessary synchronization actions in the high-level logic. This process is set forth in the article published by the inventors and entitled "Static Tokens: Using Dataflow to Automate Concurrent Pipeline Synthesis."

The resulting fine-grain processes are small enough (i.e., bit-level) to be directly implemented by the logic blocks of the asynchronous FPGA. Currently, the logic packing step, which clusters multiple fine-grain processes into a single physical logic block, is done manually and the place/route and configuration steps are done automatically. It should be noted that the asynchronous FPGA synthesis flow avoids the low level, labor-intensive, and asynchronous-specific steps of the full-custom synthesis flow (e.g., handshaking expansions, transistor netlist generation, and physical design).

Logic computations in asynchronous designs behave like fine-grain static dataflow systems, where a token traveling through an asynchronous pipeline explicitly indicates the flow of data. Channel handshakes ensure that pipeline stages consume and produce tokens in sequential order so that new data items cannot overwrite old data items. In this dataflow model, data items have one producer and one consumer. Data items needed by more than one consumer are duplicated by copy processes that produce a new token for every concurrent consumer. In contrast, clocked logic uses a global clock to separate data items in a pipeline, which allows data items to fan out to multiple receivers because they are all synchronized to the clock. Furthermore, the default behavior for a clocked pipeline is to overwrite data items on the next clock cycle, regardless of whether they were actually used for a computation in the previous cycle.

To synthesize logic for the asynchronous FPGA, a designer only needs to understand how to program for a token based dataflow computation model and is not required to know the underlying asynchronous pipelining details. This type of synchronous design, unlike clocked design, separates logical pipelining from physical pipelining. An FPGA application that is verified to functionally operate at the dataflow level is guaranteed to run on any pipelined implementation of our asynchronous-FPGA. For example, an application that operates correctly with the FPGA described in this paper will also work with an FPGA that contains twice as much pipelining, without requiring the retiming conversions necessary for clocked applications.

The main difference in logic density between asynchronous and clocked logic is the overhead of copying tokens to multiple receivers. For logic with small copies to four or fewer receivers, the output copy in the logic block provides zero overhead copy support. However, logic requiring wide copies suffers from the overhead of having to construct a copy tree with additional logic blocks. A typical example of a copy tree is when a control token needs to be copied to each bit of a wide data path. Often the latency of a control token is not critical and the copy tree can be constructed using two-way copies. This potentially allows the copy tree to be integrated with the data path logic and have zero overhead in terms of logic block counts. The copy overhead for the benchmarks used in tests ranged from 20%–33% compared with equivalent synchronous implementations, although no attempt was made to aggressively integrate copy trees.

Experimental results showed that the peak operating frequency of the first preferred embodiment of the asynchronous FPGA was 400 MHz in 0.25 μm and 700 MHz in 0.18 μm. The design is about twice as fast as commercial FPGAs, but approximately two times larger. However, the FPGA is half the size of a highly pipelined clock FPGA and of comparable performance (250 MHz in 0.4 μm). Although the performance is 36% slower than hand-placed benchmarks on a "wave-steered" clock FPGA, it is almost twice as fast for automatically-placed benchmarks.

The peak energy consumption was found to be 18 pJ/cycle in 0.25 μm and 7 pJ/cycle in 0.18 μm for a logic block configured as a four-input LUT. In addition, the interconnect energy consumption per switch point is 3 pJ/cycle in 0.25 μm and 1 pJ/cycle in 0.18 μm. Since QDI circuits do not glitch and consume power only when they contain tokens, an asynchronous FPGA automatically has perfect clock gating without the overhead associated with dynamic clock gating in synchronous designs. As a result of this event-driven energy consumption, the power consumption of an asynchronous FPGA is proportional to the number of tokens traveling through the system.

To further evaluate the performance of the asynchronous FPGA, a variety of benchmark circuits were synthesized that were used in previous clocked and asynchronous designs. While no effort was made to equalize branch mismatches or to minimize routes on token-ring pipelines and other latency-critical channels, most of the benchmarks performed within 75% of the FPGA's maximum throughput. In contrast, pipelined clocked FPGAs require substantial CAD support beyond the capabilities of generic place and route tools to achieve such performance.

The asynchronous FPGA inherently supports bit-pipelined data paths that allow data path bits to be computed concurrently, whereas clocked FPGAs implement aligned data paths that compute all data path bits together. However, due to bit-level data dependencies and aligned data path environments (e.g., memories or off-chip I/O) a bit pipelined data path in an asynchronous FPGA will behave in-between that of a fully concurrent bit-pipelined data path and a fully aligned data path.

In summary, the present invention comprises a finely pipelined asynchronous FPGA architecture that is believed to be the highest performing asynchronous FPGA by an order-of-magnitude. This asynchronous FPGA architecture distinguishes itself from that of a clocked one by its ease of pipelining, its event-driven energy consumption and its automatic adaptation to delay variations. Asynchronous logic can transparently use a pipelined interconnect without needing retiming registers and benchmark circuits can achieve good performance using synchronous place and route CAD tools.

Although the present invention has been disclosed in terms of a number of preferred embodiments, it will be understood that numerous variations and modifications could be made thereto without departing from the scope of the invention as recited in the appended claims. For example, the first asynchronous FPGA architectures included programmable arbiters, asynchronous circuits that non-deterministically select between two competing non-synchronized signals. However, arbiters occur very rarely in slack-elastic systems because they can be used only when they do not break the properties of slack elasticity. For instance, an asynchronous MIPS R3000 microprocessor used only two arbiters in its entire design. The subject asynchronous FPGA could be modified by replacing a small number of conditional units with arbiter units.

QDI asynchronous circuits are very conservative circuits in terms of delay assumptions and in that regard the results presented herein are thus the "worst" performance one can achieve with asynchronous FPGA circuits. If more aggressive circuit techniques that rely on delay assumptions are employed, then it is feasible to design faster and smaller asynchronous FPGAs, at the cost of decreased circuit robustness.

Both preferred embodiments of the invention employ an island style FPGA with a non-segmented pipelined interconnect. A segmented interconnect, where routing channels span more than one logic block, or a hierarchical interconnect (e.g., a tree structure) could be used to help reduce pipeline latency on long channel routes. In addition, advanced hardware structures found in commercial FPGAs (e.g., cascade chains, LUT-based RAM, etc.) could be added to the asynchronous FPGA to improve performance and logic density.

Additionally, while the preferred embodiments each comprise a bit-level FPGA using dual-rail channels, asynchronous logic may be more area efficient and energy efficient for multi-bit programmable data paths. These data paths consist of small N-bit ALUs, which are interconnected by N-bit wide channels that use more efficient 1-of-N data encodings. For example, a 1-of-4 channel will use one less wire than two dual-rail channels and consume half as much interconnect switching energy.

Finally, although the preferred embodiments make use of handshaking for flow control, the principles of handshaking and flow-control can also be emulated with a clocked implementation as is well known by those with ordinary skill in the art, and while this may not be as efficient it can also lead to some of the desirable properties described. In such an embodiment, there is still no global clock but unsynchronized clocks could be employed for controlling operation of the individual pipeline stages.

What is claimed is:

1. A programmable asynchronous logic array, comprising: an array of logic cells, each said logic cell including at least a function unit for computing one or more logic functions on a plurality of inputs, said function unit being implemented by a plurality of asynchronous pipeline stages; and a plurality of asynchronous interconnects for connecting said logic cells to one another.

2. The array of claim 1, wherein each of said asynchronous pipeline stages includes an asynchronous channel for sending and receiving data tokens to or from other of the pipeline stages and said channel includes an enable line for implementing handshaking control with other of the pipeline stages.

3. The array of claim 2, wherein said pipeline stages are selected from the group including a precharge half buffer pipeline stage, a weak condition half buffer pipeline stage, a GasP pipeline stage, a bundled data pipeline stage and a pulse logic pipeline stage.

4. The array of claim 1, wherein each said logic cell further includes a conditional unit for generating an output based on conditions of one or more input values, said conditional unit also being implemented with a plurality of said pipeline stages.

5. The array of claim 1, wherein said interconnect further includes a plurality of asynchronous pipelined switch boxes.

6. The array of claim 1, wherein said function unit includes a carry pipeline for generating carry chains for arithmetic computations.

7. The array of claim 6, wherein said carry pipeline includes means for generating a carry-out token before a carry-in token arrives when the carry-in token is not necessary for generation of the carry-out token.

8. A programmable asynchronous logic array, comprising: an array of Logic cells, each said Logic cell including at least a function unit for computing one or more logic functions on a plurality of inputs; and a plurality of interconnects for connecting said logic cells to one another, wherein said interconnects and function units are configured to operate asynchronously on data tokens that are communicated on a plurality of message-passing channels, said message passing channels being implemented at least in part by using clockless asynchronous handshake protocols.

9. The array of claim 8, wherein said function units are implemented using a plurality of pipeline stages, each of which is selected from the group including a precharge half buffer pipeline stage, a weak condition half buffer pipeline stage, a GasP pipeline stage, a bundled data pipeline stage and a pulse logic pipeline stage.

10. A programmable asynchronous logic array, comprising: an array of logic cells, each said logic cell including at least a function unit for computing one or more logic functions on a plurality of inputs; and a plurality of interconnects for connecting said logic cells to one another, wherein said interconnects and function units are configured to operate asynchronously on data tokens that are communicated on message-passing channels and wherein each said function unit is implemented with one or more logic elements that combine computation with data latching, thereby eliminating the need for output latches in the logic cell.

11. The array of claim 10, wherein each logic cell further includes a conditional unit for generating an output based on conditions of one or more input values, said conditional unit also being implemented with one or more logic elements that combine computation with data latching.

12. The array of claim 11, wherein said conditional unit is implemented using a handshake control circuit that combines a merge conditional input process with a split conditional output process to reduce the size of said conditional unit.

13. A programmable asynchronous logic array, comprising: an array of logic cells, each said logic cell including at least a function unit for computing one or more logic functions on a plurality of inputs; a plurality of interconnects for connecting said logic cells to one another; and an output copy pipeline stage for both token copying and token routing, said output copy pipeline stage including a plurality of inputs which receive data tokens from said function unit on a plurality of message-passing channels, wherein said interconnects and function units are configured to operate asynchronously on said data tokens that are communicated on said message-passing channels.

14. The array of claim 13, wherein said output copy pipeline stage is implemented using a plurality of a plurality of mux switches, each of which includes a plurality of inputs for receiving tokens on a plurality of channels and an output connected to an input of a corresponding pipeline stage.

15. The array of claim 14, wherein said output copy pipeline stage also includes a plurality of programmable C elements, each of which is implemented by a configurable two input pull down stack having an output connected to an input of a standard C element.

16. A programmable asynchronous logic array, comprising: an array of logic cells, each said logic cell including at least a function unit for computing one or more logic functions on a plurality of inputs; and a plurality of interconnects for connecting said logic cells to one another, wherein said interconnects and function units are configured to operate asynchronously on data tokens that are communicated on message-passing channels and wherein said interconnect further includes a plurality of asynchronous pipelined switch boxes.

17. A programmable asynchronous logic array, comprising: an array of logic cells, each said logic cell including at least a function unit for computing one or more logic functions on a plurality of inputs; and a plurality of interconnects for connecting said logic cells to one another, wherein said interconnects and function units are configured to operate asynchronously on data tokens that are communicated on message-passing channels and wherein said function unit includes a carry pipeline for generating carry chains for arithmetic computations.

18. The array of claim 17, wherein said carry pipeline includes means for generating a carry-out token before a carry-in token arrives when the carry-in tokens are not necessary for generation of the carry-out token.

19. A method for operating a programmable logic array comprising the steps of:
providing an array of logic cells, each said logic cell including at least a function unit for computing one or more logic functions on a plurality of inputs; and a plurality of message-passing channels containing interconnects for connecting said logic cells to one another; and
asynchronously sending data from one of said function units to another using data tokens that are communicated on said message-passing channels using, at least in part, clockless handshake protocols.

20. A method for operating a programmable logic array comprising the steps of:

providing an array of logic cells, each said logic cell including at least a function unit for computing one or more logic functions on a plurality of inputs; and a plurality of message-passing channels containing interconnects for connecting said logic cells to one another; and asynchronously sending data from one of said function units to another using data tokens that are communicated on said message-passing channels The method of claim 19, wherein each cell generates an output based on conditions of one or more input values using a conditional unit that is implemented with a plurality of pipeline stages.

21. A method for operating a programmable logic array comprising the steps of:

providing an array of logic cells, each said logic cell including at least a function unit for computing one or more logic functions on a plurality of inputs; and a plurality of message-passing channels containing interconnects for connecting said logic cells to one another; and asynchronously sending data from one of said function units to another using data tokens that are communicated on said message-passing channels The method of claim 19, wherein said function unit generates carry chains for arithmetic computations using a carry pipeline.

22. The method of claim 21, wherein said carry pipeline generates a carry-out token before a carry-in token arrives when the carry-in tokens are not necessary for generation of the carry-out token.

23. A method for operating a programmable logic array comprising the steps of:

providing an array of logic cells, each said logic cell including at least a function unit for computing one or more logic functions on a plurality of inputs; and a plurality of message-passing channel containing interconnects for connecting said logic cells to one another; wherein said function units are implemented using a plurality of pipeline stages, each of which is selected from the group including a precharge half buffer pipeline stage, a weak condition half buffer pipeline stage, a GasP pipeline stage, a bundled data pipeline stage and a pulse logic pipeline stage; and asynchronously sending data from one of said function units to another using data tokens that are communicated on said message-passing channels.

24. A method for operating a programmable logic array comprising the steps of:

providing an array of logic cells, each said logic cell including at least a function unit for computing one or more logic functions on a plurality of inputs; and a plurality of message-passing channels containing interconnects for connecting said logic cells to one another; wherein each said function unit is implemented with one or more logic elements that combine computation with data latching, thereby eliminating the need for output latches in the logic cell; and asynchronously sending data from one of said function units to another using data tokens that are communicated on said message-passing channels.

25. The method of claim 24, wherein each logic cell further includes a conditional unit for generating an output based on conditions of one or more input values, said conditional unit also being implemented with one or more logic elements that combine computation with data latching.

26. A method for operating a programmable logic array comprising the steps of:

providing an array of logic cells, each said logic cell including at least a function unit for computing one or more logic functions on a plurality of inputs; and a plurality of message-passing channels containing interconnects for connecting said logic cells to one another; and asynchronously sending data from one of said function units to another using data tokens that are communicated on said message-passing channels, wherein each function unit communicates data tokens to an output copy pipeline stage in said cell, said output copy pipeline stage serving to both copy and route said tokens.

* * * * *